US008345475B2

(12) United States Patent
Lam et al.

(10) Patent No.: US 8,345,475 B2
(45) Date of Patent: Jan. 1, 2013

(54) NON VOLATILE CELL AND ARCHITECTURE WITH SINGLE BIT RANDOM ACCESS READ, PROGRAM AND ERASE

(75) Inventors: Chung H. Lam, Peekskill, NY (US); Mark C. H. Lamorey, South Burlington, VT (US); Thomas M. Maffitt, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 416 days.

(21) Appl. No.: 12/619,771

(22) Filed: Nov. 17, 2009

(65) Prior Publication Data
US 2011/0116312 A1    May 19, 2011

(51) Int. Cl.
*G11C 16/04* (2006.01)
(52) U.S. Cl. .............................. 365/185.03; 365/185.18
(58) Field of Classification Search ............. 365/185.03, 365/185.18
See application file for complete search history.

(56) References Cited

U.S. PATENT DOCUMENTS

| | | | |
|---|---|---|---|
| 6,018,178 A * | 1/2000 | Sung | 257/316 |
| 6,436,768 B1 | 8/2002 | Yang | 438/266 |
| 6,518,614 B1 | 2/2003 | Breitwisch | 257/298 |
| 6,903,407 B1 | 6/2005 | Kang | 257/315 |
| 7,005,697 B2 | 2/2006 | Batra | 257/315 |
| 7,049,189 B2 | 5/2006 | Chang | 438/211 |
| 7,071,061 B1 | 7/2006 | Pittikoun | 438/267 |
| 7,075,144 B2 | 7/2006 | Kim | 257/324 |
| 7,112,493 B2 | 9/2006 | Bertin | 438/275 |
| 7,184,312 B2 | 2/2007 | Bhattacharyya | 365/185.19 |
| 7,266,014 B2 | 9/2007 | Wu | 365/185.01 |

* cited by examiner

*Primary Examiner* — Huan Hoang
(74) *Attorney, Agent, or Firm* — Ido Tuchman; Vazken Alexanian

(57) ABSTRACT

One embodiment is a non-volatile memory cell with random access read, program, and erase. The memory cell includes a cell transistor that includes a source region, a drain region, a first insulating spacer, and a second insulating spacer. The memory cell also includes a source-side transistor, a drain-side transistor, a source-side multiplexer, a drain-side multiplexer, a source-side sense amplifier, and a drain-side write driver. A first binary value is stored in a first bit in the memory cell by trapping or releasing a first electric charge in the first insulating spacer. The first bit is read by sensing the resistive change in the cell transistor or by sensing the threshold voltage change in the cell transistor.

24 Claims, 5 Drawing Sheets

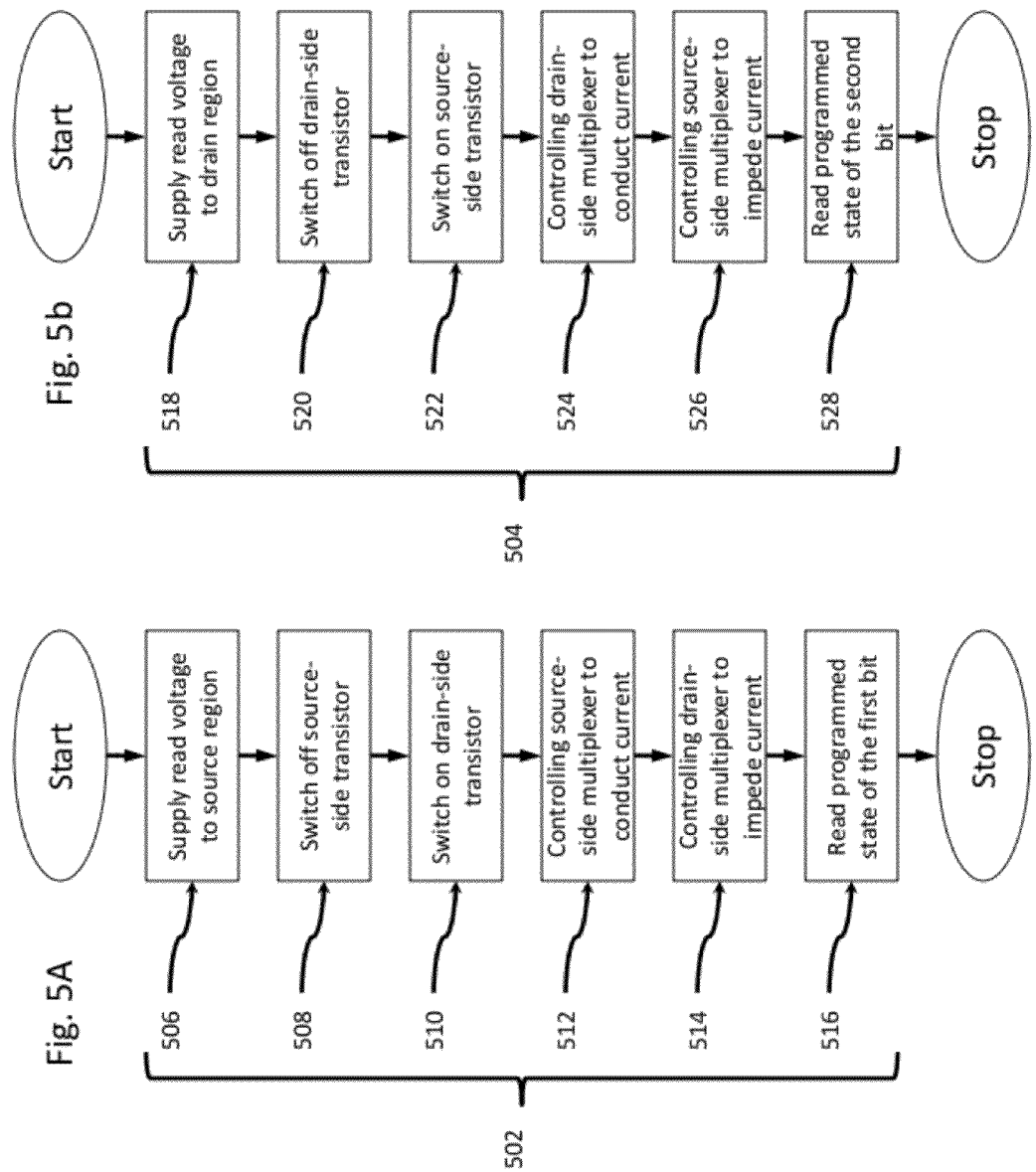

NON VOLATILE CELL AND ARCHITECTURE WITH SINGLE BIT RANDOM ACCESS READ, PROGRAM AND ERASE

BACKGROUND OF THE INVENTION

1. Field of the Invention

The present invention relates to computer memory and more specifically to random access read, program, and erase memory.

2. Description of Background

There are two major groups of computer memory, volatile memory and non-volatile memory. In volatile memory constant energy input is required to retain information while in non-volatile memory constant energy input is not required. Examples of volatile memory devices include Dynamic Random Access Memory (DRAM) and Static Random Access Memory (SRAM). DRAM requires the memory element to be constantly refreshed (requiring energy) while SRAM requires a constant supply of energy to maintain the state of the memory element. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM). As stated, the information in the memory elements of non-volatile memory can be retained for days to decades without power consumption. The present invention is directed to flash electrical erasable read only memory.

A problem in flash memory is that reading, programming, and erasing operations are carried out in blocks. That is, an entire group of bits in a flash device must be read, programmed, or erased at the same time. This poses problems pertaining to read and write speeds of the flash memory device.

SUMMARY OF THE INVENTION

An aspect of the present invention is a memory cell. The memory cell includes of a cell transistor including a gate region, a source region, a drain region, and a first insulating spacer proximate the drain region and abutting the gate region. The cell transistor is configured to trap a first electric charge in the first insulating spacer when a first bit in the memory cell is programmed to a first binary. The cell transistor is also configured to release the first electric charge in the first insulating spacer when the first bit in the memory cell is programmed to a second binary state. The memory cell includes of a source-side sense amplifier configured to read a programmed state of the first bit. The memory cell also includes a drain-side write driver configured to supply a program voltage to the drain region when the first bit is programmed. The memory cell includes a source-side transistor and a drain-side transistor. The source-side transistor is configured to conduct current from the source region to ground when the first bit is programmed to the first binary state. The source-side transistor is also configured to impede current from the source region to ground when the first bit is programmed to the second binary state and when the first bit is read. The drain-side transistor is configured to conduct current from the drain region to ground when the first bit is read. The drain-side transistor is also configured to impede current from the drain region to ground when the first bit is programmed.

Another aspect of the present invention is a memory array. The memory array includes a plurality of memory cells. Each memory cell of the plurality of memory cells includes a cell transistor. The cell transistor includes a gate region, a source region, a drain region, a first insulating spacer proximate the drain region and abutting the gate region, and a second insulating spacer proximate the source region and abutting the gate region. The cell transistor is configured to trap a first electric charge in the first insulating spacer when a first bit in the memory cell is programmed to a first binary state. The cell transistor is also configured to release the first electric charge in the first insulating spacer when the first bit in the memory cell is programmed to a second binary state. The cell transistor is configured to trap a second electric charge in the second insulating spacer when a second bit in the memory cell is programmed to the first binary state. The cell transistor is also configured to release the second electric charge in the second insulating spacer when the second bit in the memory cell is programmed to the second binary state. The memory array includes a source-side sense amplifier/write driver unit. The source-side sense amplifier/write driver unit is configured to read a programmed state of the first bit and to supply a program voltage to the source region when the second bit is programmed. The memory array includes a drain-side sense amplifier/write driver unit. The drain-side sense amplifier/write driver unit is configured to read a programmed state of the second bit and to supply the program voltage to the drain region when the first bit is programmed. The memory array includes a source-side transistor. The source-side transistor is configured to conduct current from the source region to ground when the first bit is programmed to the first binary state and when the second bit is read. The source-side transistor is also configured to impede current from the source region to ground when the first bit is programmed to the second binary state, when the first bit is read, and when the second bit is programmed. The memory array also includes a drain-side transistor. The drain-side transistor is configured to conduct current from the drain region to ground when the first bit is read and when the second bit is programmed to the first binary state. The drain-side transistor is also configured to impede current from the drain region to ground when the first bit is programmed, when the second bit is programmed to the second binary state, and when the second bit is read.

Yet another aspect of the present invention is a method for operating a memory cell. The method includes programming a first bit in the memory cell to a first binary state by trapping a first electric charge in a first insulating spacer of a cell transistor. The first insulating spacer is proximate a drain region and abuts a gate region of the cell transistor. The method includes programming the first bit in the memory cell to a second binary state by releasing the first electric charge in the first insulating spacer of the cell transistor. The method also includes reading the programmed state of the first bit in the memory cell by sensing a leakage current at the drain region of the cell transistor.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 illustrates a method for reading a first and second bit.

DETAILED DESCRIPTION OF THE INVENTION

The present invention is described with reference to embodiments of the invention. Throughout the description of the invention reference is made to FIGS. 1-5.

As described below, an aspect of the present invention is a non-volatile memory cell. The memory cell is comprised of a cell transistor including a gate region, a source region, a drain region, and a first insulating spacer proximate the drain region and abutting the gate region. The cell transistor is configured to trap a first electric charge in the first insulating spacer when a first bit in the memory cell is programmed to a first binary state and is configured to release the first electric charge in the first insulating spacer when the first bit in the memory cell is programmed to a second binary state. By trapping or releasing the first electric charge in the first insulating spacer a detectable difference in the threshold voltage of the cell transistor is created. Thus, binary values may be stored and read as individual resistances.

Figure 1:
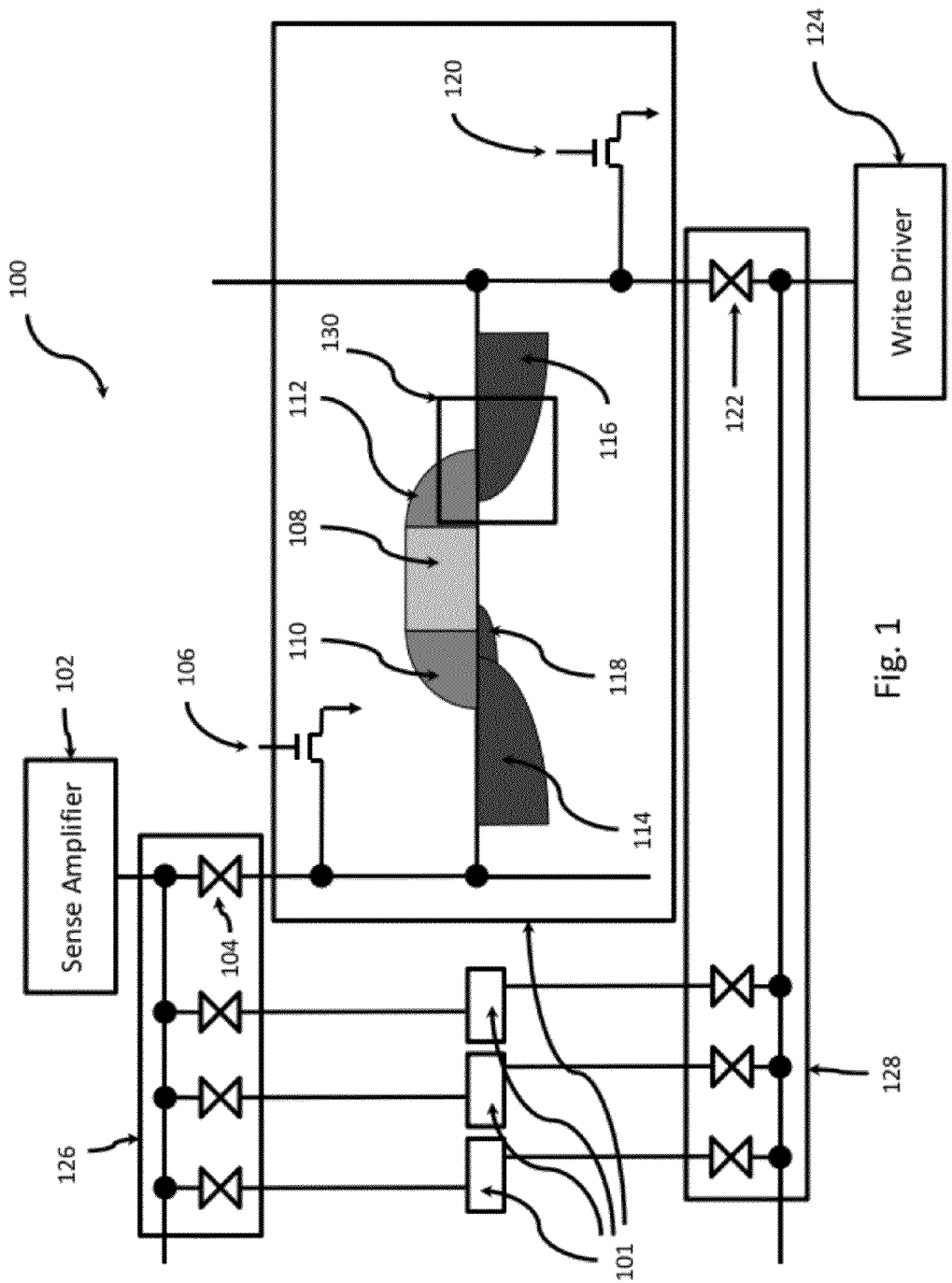
FIG. 1 illustrates a single-bit memory cell.

FIG. 1 illustrates one embodiment of a single-bit non-volatile memory cell within a memory array 100 contemplated by the present invention. The memory array 100 includes a plurality of memory cells 101, a source-side sense amplifier 102, and a drain-side write driver 124. Each memory cell of the plurality of memory cells 101 includes the cell transistor including the gate region 108, the source region 114, the drain region 116. A first insulating spacer 112 is positioned proximate the drain region 116 and abutting the gate region 108. A second insulating spacer 110 is positioned proximate the source region 114 and abutting the gate region 108. The memory cell also includes a source-side transistor 106 electrically coupled to the cell transistor and a ground. A drain-side transistor 120 is electrically coupled to the cell transistor and ground. A source-side multiplexer 104 is electrically coupled to the cell transistor and source-side sense amplifier 102. In addition, a drain-side multiplexer 122 is electrically coupled to the cell transistor and the drain-side write driver 124. In one particular embodiment of the invention, the memory cell also includes an extension implant 118 abutting the source region 114 and forming an underlap under the gate region 108.

The cell transistor of each single-bit non-volatile memory cell is configured to store binary data in a first bit 130. The cell transistor of the memory cell is configured to trap the first electric charge in first insulating spacer 112 when the first bit 130 is programmed to a first binary state (described below). The cell transistor of the memory cell is also configured to release the first electric charge in the first insulating spacer 112 when the first bit 130 is programmed to a second binary state (described below).

The source-side sense amplifier 102 is configured to read a programmed state of the first bit 130 (described below). The drain-side write driver 124 is configured to supply a program voltage to the drain region 116 when the first bit 130 is programmed (described below).

The source-side transistor 106 is configured to conduct current from the source region 114 to ground when the first bit 130 is programmed to the first binary state. The source-side transistor 106 is configured to impede current from the source region 114 to ground when the first bit 130 is programmed to the second binary state. The source-side transistor 106 is also configured to impede current from the source region 114 to ground when the first bit 130 is read. The drain-side transistor 120 is configured to conduct current from the drain region 116 to ground when the first bit 130 is read. The drain-side transistor is also configured to impede current from the drain region 116 to ground when the first bit 130 is programmed.

The source-side multiplexer 104 is configured to conduct current from the source region 114 to the source-side sense amplifier 102 when the first bit 130 is read. The source-side multiplexer 104 is also configured to impede current from the source region 114 to the source-side sense amplifier 102 when the first bit 130 is programmed. The drain-side multiplexer 122 is configured to conduct current from the drain region 116 to the drain-side write driver 124 when the first bit 130 is programmed. The drain-side multiplexer 122 is also configured to impede current from the drain region 116 to the drain-side write driver 124 when the first bit 130 is read.

As discussed above, the memory array 100 includes a plurality of memory cells 101. Each memory cell 101 includes the transistor arrangement discussed above. As illustrated, a plurality of source-side multiplexers 104 is electrically coupled to the source-side sense amplifier 102. Each individual source-side multiplexer of the plurality of source-side multiplexers 104 is electrically coupled to an individual cell transistor of the plurality of cell transistors via the source region. Additionally, a plurality of drain-side multiplexers 122 is electrically coupled to the drain-side write driver 124. Each individual drain-side multiplexer of the plurality of drain-side multiplexers 122 is electrically coupled to an individual cell transistor of the plurality of cell transistors via the drain region.

In one embodiment of the invention, the drain-side multiplexers 122 are carried in an array drain multiplexer 128. The array drain multiplexer 128 is configured to select one of the plurality of drain-side multiplexers 122 during a program operation. Thus, when the first bit 130 is programmed, no other bits in the memory array 100 are simultaneously programmed. In this manner, the embodiment can perform a non-block write/erase function.

Similarly, the source-side multiplexers 104 are carried in an array source multiplexer 126. The array source multiplexer is configured to select one of the plurality of source-side multiplexers 104 during a read operation. Thus, when the first bit is read, no other bits in the memory array 100 are simultaneously read.

Figure 2:
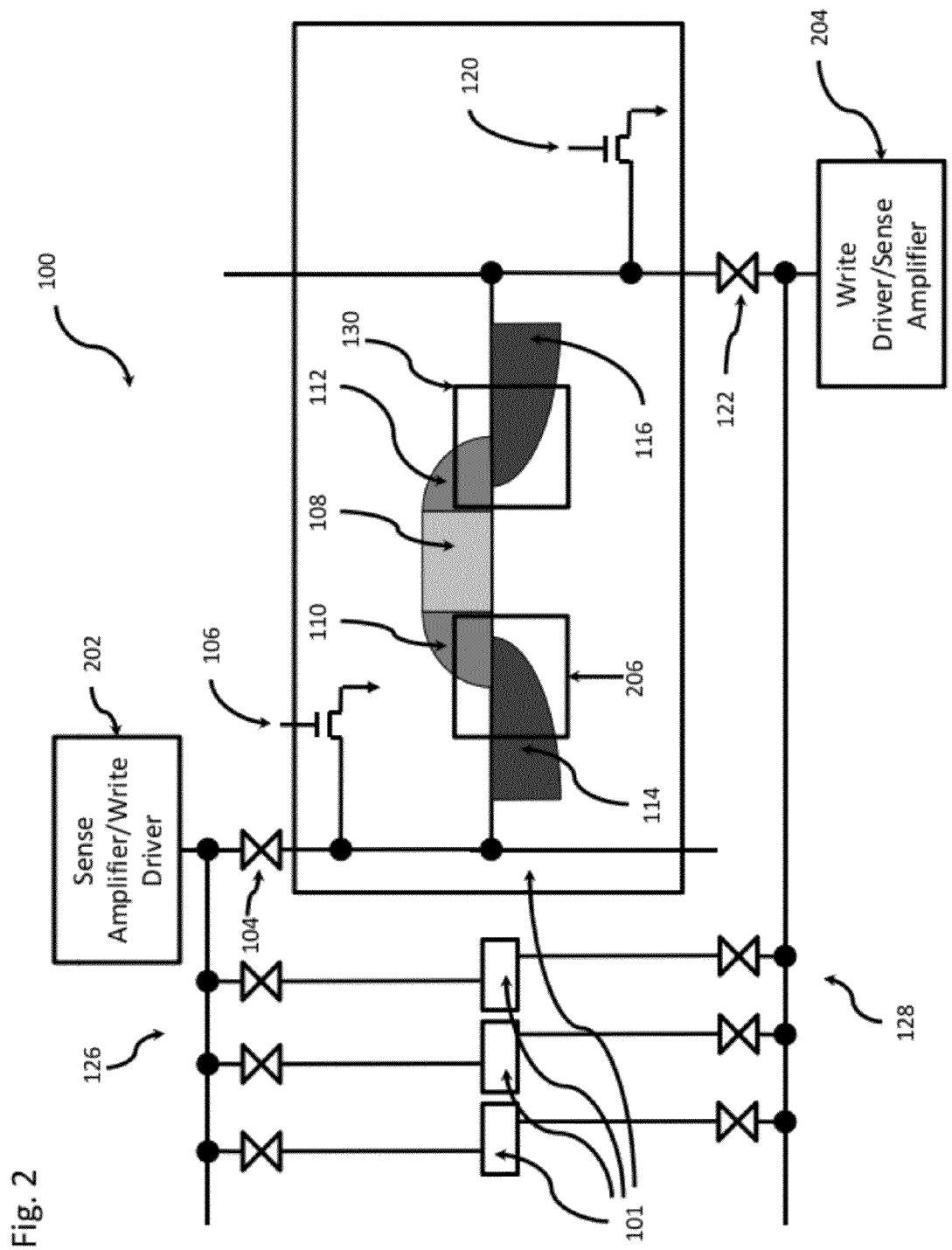
FIG. 2 illustrates a multi-bit memory cell.

Now turning to FIG. 2, illustrative embodiments of a multi-bit non-volatile memory cell and a memory array are shown. In this particular embodiment of the invention, a second bit 206, along with the first bit 130, is stored in the memory cell. The cell transistor is configured to trap a second electric charge in the second insulating spacer 110 when the second bit 206 is programmed to the first binary state. The cell transistor is configured to release the second electric charge in the second insulating spacer 110 when the second bit 206 is programmed to the second binary state.

In the multi-bit memory cell, the source-side sense amplifier now acts as a drain-side sense amplifier/write driver 202 and the drain-side write driver now acts as a drain-side sense amplifier/write driver 204. In this embodiment of the invention, the source-side sense amplifier/write driver 202 is configured to supply a program voltage to the source region 114 when the second bit 206 is programmed. Additionally, the drain-side sense amplifier/write driver 204 is configured to read a programmed state of the second bit 206.

In the multi-bit memory cell the source-side transistor 106, the drain-side transistor 120, the source-side multiplexer 104, and the drain-side multiplexer 122 are now further configured to conduct and impede current for the programming and reading of the second bit 206. The source-side transistor 106 is configured to conduct current from the source region 114 to ground when the second bit 206 is read. The source-side transistor 106 is configured to impede current from the source region 114 to ground when the second bit 206 is programmed. The drain-side transistor 120 is configured to conduct current from the drain region 116 to ground when the second bit 206 is programmed to the first binary state. The drain-side transistor 120 is configured to impede current from the drain region 116 to ground when the second bit 206 is programmed to the second binary state. The drain-side transistor 120 is also configured to impede current from the drain region 116 to ground when the second bit 206 is read.

The source-side multiplexer 104 is configured to conduct current from the source region 114 to the source-side sense amplifier/write driver 202 when the second bit 206 is programmed. The source-side multiplexer 104 is configured to impede current from the source region 114 to the source-side sense amplifier/write driver 202 when the second bit 206 is read. The drain-side multiplexer 122 is configured to conduct current from the drain region 116 to the drain-side sense amplifier/write driver 204 when the second bit 206 is read. The drain-side multiplexer 122 is configured to impede current from the drain region 116 to the drain-side sense amplifier/write driver 204 when the second bit 206 is programmed.

As mentioned above, in one embodiment of the invention, the drain-side multiplexers 122 are carried in the array drain multiplexer 128. The array drain multiplexer 128 is configured to select one of the plurality of drain-side multiplexers 122 during a program or a read operation. Thus, when either the first bit 130 or the second bit 206 is programmed or read, no other bits in the memory array 100 are simultaneously programmed or read. In this manner, the embodiment can perform a non-block write/erase function.

Similarly, the source-side multiplexers 104 are carried in the array source multiplexer 126. The array source multiplexer is configured to select one of the plurality of source-side multiplexers 104 during a program or a read operation. Thus, when either the first bit 130 or the second bit 206 is programmed or read, no other bits in the memory array 100 are simultaneously programmed or read.

Figure 3A:
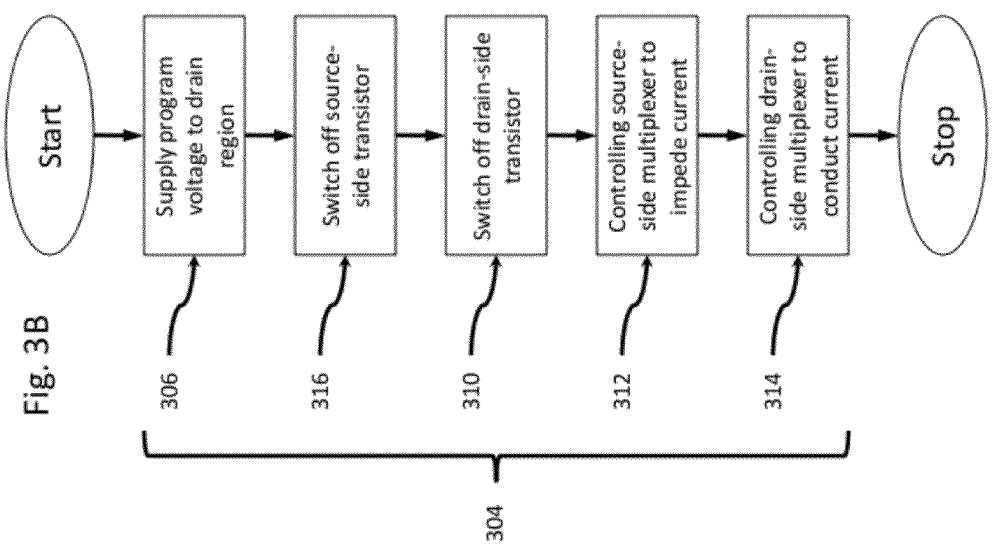
FIG. 3 illustrates a method for programming a first bit.
Figure 3B:
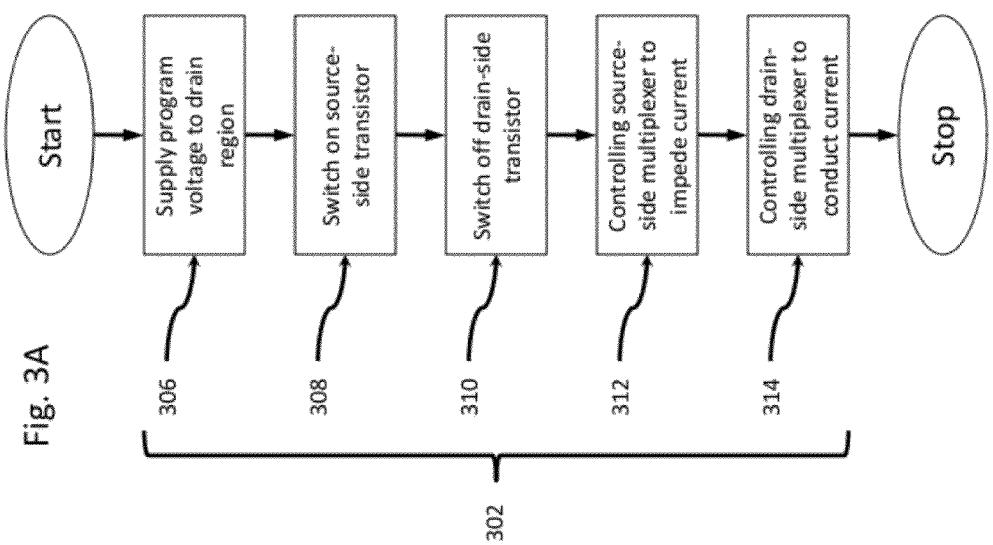

FIG. 3A and FIG. 3B illustrate example methods for programming the first bit in the memory cell. More specifically, FIG. 3A illustrates an example method to program the first bit to the first binary state and FIG. 3B illustrates an example method to program the first bit to the second binary state.

As stated above, programming of the first bit to the first binary state includes a process 302 of trapping the first electric charge in the first insulating spacer of the cell transistor. The process 302 allows the current from the programming voltage to flow from the drain-side write driver to the drain region. The current then flows through the cell transistor as a first electric charge is trapped in the first insulating spacer. Finally, the current flows from the source region through the source-side transistor and to ground.

The programming of the first bit to the second binary state includes a process 304 of releasing the first electric charge in the first insulating spacer of the cell transistor. The process 304 allows the current from the programming voltage to flow from the drain-side write driver to the drain region. The current, however, is not permitted to flow to ground via the source region and the source-side transistor and the first electric charge is released from the first insulating spacer.

In FIG. 3A, the process 302 of trapping the first electric charge in the first insulating spacer of the cell transistor begins with supplying operation 306. During supplying operation 306 the drain-side write driver (or drain-side sense amplifier/write driver in multi-bit memory cells) supplies a programming voltage for the drain region. Those skilled in the art will recognize that the programming voltage is dependent on a variety of factors such as materials of the insulating spacers, the source region, the drain region, and the magnitude of charge to be trapped in the first insulating spacer. In one particular embodiment of the invention the programming voltage is less than 5V. In another embodiment of the invention the programming voltage is 3.5V. After supplying operation 306 is completed control passes to switching operation 308.

During switching operation 308 the source-side transistor is switched on. In other words, the source-side transistor provides a source-side low resistance path from the source region to ground. After switching operation 308 is completed control passes to switching operation 310.

During switching operation 310 the drain-side transistor is switched off. In other words, the drain-side transistor provides a drain-side high resistance path from the drain region to ground. After switching operation 310 is completed control passes to controlling operation 312.

During controlling operation 312 the source-side multiplexer impedes current from the source region to the source-side sense amplifier (or source-side sense amplifier/write driver in multi-bit memory cells). After controlling operation 312 is completed control passes to controlling operation 314.

During controlling operation 314 the drain-side multiplexer conducts current from the drain region to the drain-side write driver (or drain-side sense amplifier/write driver in multi-bit memory cells). As discussed above, the array drain multiplexer may prevent other bits in the array from being programmed. Thus, a single bit or non-block write function can be performed. After controlling operation 314 is completed the process 302 ends.

In FIG. 3B, the process 304 of releasing the first electric charge in the first insulating spacer of the cell transistor begins with supplying operation 306. During supplying operation 306 the drain-side write driver (or drain-side sense amplifier/write driver in multi-bit memory cells) supplies a programming voltage for the drain region. Again, those skilled in the art will recognize that the programming voltage is dependent on a variety of factors such as, but not limited to, materials of the insulating spacers, the source region geometry, the drain region geometry, and the magnitude of charge trapped in the first insulating spacer. In one particular embodiment of the invention the programming voltage is less than 5V. In another embodiment of the invention the programming voltage is 3.5V. After supplying operation 306 is completed control passes to switching operation 316.

During switching operation 316 the source-side transistor is switched off. In other words, the source-side transistor provides a source-side high resistance path from the source region to ground. After switching operation 316 is completed control passes to switching operation 310.

During switching operation 310 the drain-side transistor is switched off. In other words, the drain-side transistor provides a drain-side high resistance path from the drain region to ground. After switching operation 310 is completed control passes to controlling operation 312.

During controlling operation 312 the source-side multiplexer impedes current from the source region to the source-side sense amplifier (or source-side sense amplifier/write driver in multi-bit memory cells). After controlling operation 312 is completed control passes to controlling operation 314.

During controlling operation 314 the drain-side multiplexer conducts current from the drain region to the drain-side write driver (or drain-side sense amplifier/write driver in multi-bit memory cells). As discussed above, the array drain multiplexer may prevent other bits in the array from being programmed. Thus, a single bit or non-block erase function can be performed. After controlling operation 314 is completed the process 304 ends.

Figure 4A:
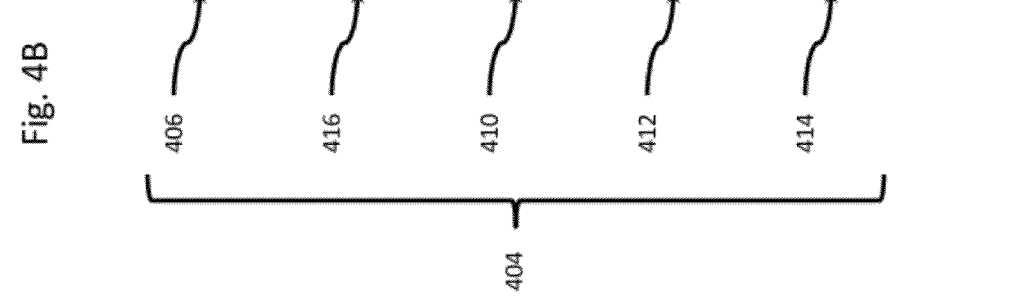
FIG. 4 illustrates a method for programming a second bit.
Figure 4B:
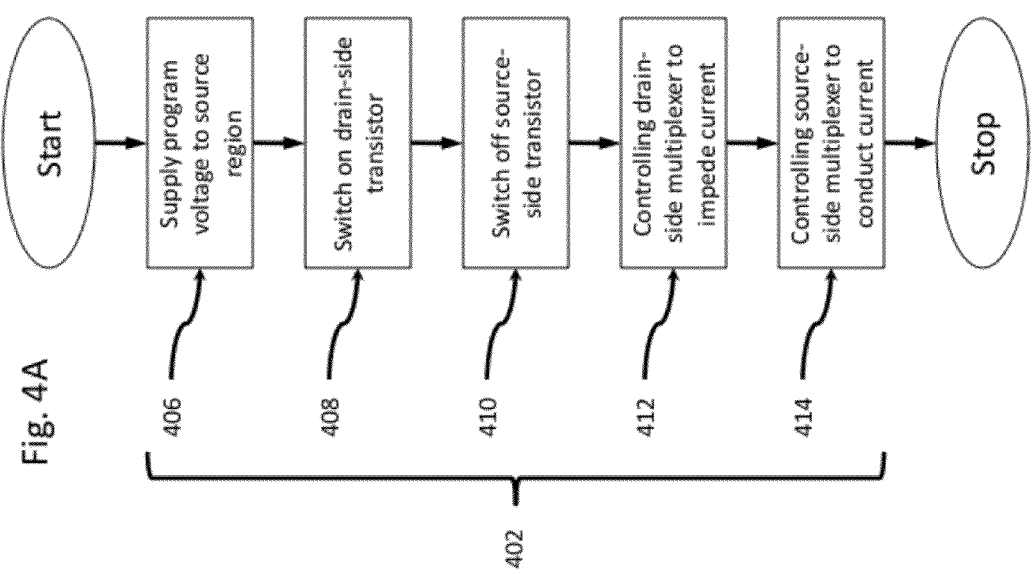

FIG. 4A shows an example method for programming the second bit to the first binary state and FIG. 4B shows an example method for programming the second bit to the second binary state. As stated above, the programming of the second bit to the first binary state includes a process 402 of trapping the second electric charge in the second insulating spacer of the cell transistor. The process 402 allows the current from the programming voltage to flow from the source-side sense amplifier/write driver to the source region. The current then flows through the cell transistor as the second electric charge is being trapped in the second insulating spacer. Finally, the current flows from the drain region through the drain-side transistor and to ground.

The programming of the second bit to the second binary state includes a process 404 of releasing the second electric charge in the second insulating spacer of the cell transistor. The process 404 allows the current from the programming voltage to flow from the source-side sense amplifier/write driver to the source region. The current, however, is not allowed to flow to ground via the drain region and the drain-side transistor and the second electric charge is released from the second insulating spacer.

In FIG. 4A, the process 402 of trapping the second electric charge in the second insulating spacer of the cell transistor begins with supplying operation 406. During supplying operation 406 the source-side sense amplifier/write driver supplies a programming voltage for the source region. Those skilled in the art will recognize that the programming voltage is dependent on a variety of factors, such as, materials of the insulating spacers, the source region geometry, the drain region geometry, and the magnitude of charge to be trapped in the second insulating spacer. In one particular embodiment of the invention the programming voltage is less than 5V. In another embodiment of the invention the programming voltage is 3.5V. After supplying operation 406 is completed control passes to switching operation 408.

During switching operation 408 the drain-side transistor is switched on. In other words, the drain-side transistor provides a drain-side low resistance path from the drain region to ground. After switching operation 408 is completed control passes to switching operation 410.

During switching operation 410 the source-side transistor is switched off. In other words, the source-side transistor provides a source-side high resistance path from the source region to ground. After switching operation 410 is completed control passes to controlling operation 412.

During controlling operation 412 the drain-side multiplexer impedes current from the drain region to the drain-side sense amplifier/write driver. After controlling operation 412 is completed control passes to controlling operation 414.

During controlling operation 414 the source-side multiplexer conducts current from the source region to the source-side sense amplifier/write driver. After controlling operation 414 is completed the process 402 ends. As discussed above, the array source multiplexer may prevent other bits in the array from being programmed. Thus, a single bit or non-block write function can be performed.

In FIG. 4B, the process 404 of releasing the second electric charge in the second insulating spacer of the cell transistor begins with supplying operation 406. During supplying operation 406 the source-side sense amplifier/write driver supplies a programming voltage for the source region. Again, those skilled in the art will recognize that the programming voltage is dependent on a variety of factors such as, but not limited to, materials of the insulating spacers, the source region geometry, the drain region geometry, and the magnitude of charge trapped in the second insulating spacer. In one particular embodiment of the invention the programming voltage is less than 5V. In another embodiment of the invention the programming voltage is 3.5V. After supplying operation 406 is completed control passes to switching operation 416.

During switching operation 416 the drain-side transistor is switched off. In other words, the drain-side transistor provides a drain-side high resistance path from the drain region to ground. After switching operation 416 is completed control passes to switching operation 410.

During switching operation 410 the source-side transistor is switched off. In other words, the source-side transistor provides a source-side high resistance path from the source region to ground. After switching operation 410 is completed control passes to controlling operation 412.

During controlling operation 412 the drain-side multiplexer impedes current from the drain region to the drain-side sense amplifier/write driver. After controlling operation 412 is completed control passes to controlling operation 414.

During controlling operation 414 the source-side multiplexer conducts current from the source region to the source-side sense amplifier/write driver. After controlling operation 414 is completed the process 404 ends. As discussed above, the array source multiplexer may prevent other bits in the array from being programmed. Thus, a single bit or non-block erase function can be performed.

Now turning to FIG. 5, example methods for reading the memory cell are shown. More specifically, FIG. 5A, includes an example process 502 for sensing a leakage current at the drain region. FIG. 5B includes an example process 504 for sensing a leakage current at the source region. The process 502 includes configuring a current pathway such that a read voltage current travels from source-side sense amplifier/write driver, through the cell transistor, and to ground via the drain-side transistor. The process 504 for reading the second bit includes configuring a current pathway such that the read voltage current travels from the drain-side sense amplifier/write driver, through the cell transistor, and to ground via the source-side transistor.

In FIG. 5A, the process 502 begins at supplying operation 506. During supplying operation 506 the source-side sense amplifier/write driver supplies the read voltage for the source region. Those skilled in the art will recognize that the read voltage is dependent on a variety of factors such as, but not limited to, materials of the insulating spacers, the source region geometry, the drain region geometry, and the magnitude of charge trapped in the first insulating spacer. In one particular embodiment of the invention the programming voltage is less than 2V. In another embodiment of the invention the programming voltage is 1.2V. After supplying operation 506 is completed control passes to switching operation 508.

During switching operation 508 the source-side transistor is switched off. In other words, the source-side transistor provides a source-side high resistance path from the source region to ground. After switching operation 508 is completed control passes to switching operation 510.

During switching operation 510 the drain-side transistor is switched on. In other words, the drain-side transistor provides a drain-side low resistance path from the drain region to ground. After switching operation 510 is completed control passes to controlling operation 512.

During controlling operation 512 the source-side multiplexer conducts current from the source region to the source-side sense amplifier/write driver. After controlling operation 512 is completed control passes to controlling operation 514.

During controlling operation 514 the drain-side multiplexer impedes current from the drain region to the drain-side sense amplifier/write driver. After controlling operation 514 is completed control passes to reading operation 516.

During reading operation 516 the programmed state of the first bit is read. Reading operation 516 includes sensing the threshold voltage of the cell transistor. For example, if the threshold voltage (from source to drain) of the cell transistor is high then the first electric charge is trapped in the first insulating spacer (the first binary state). If the threshold voltage (from source to drain) of the cell transistor is low then the first electric charge is not trapped in the first insulating spacer (the second binary state). In another embodiment of the invention, the change in resistance of the cell transistor is sensed in order to determine the binary state programmed to the first bit. After reading operation 516 is completed the process 502 ends.

In FIG. 5B, the process 504 begins at supplying operation 518. During supplying operation 518 the drain-side sense amplifier/write driver supplies the read voltage for the drain region. Those skilled in the art will recognize that the read voltage is dependent on a variety of factors such as, but not limited to, materials of the insulating spacers, the source region geometry, the drain region geometry, and the magnitude of charge trapped in the second insulating spacer. In one particular embodiment of the invention the programming voltage is less than 2V. In another embodiment of the invention the programming voltage is 1.2V. After supplying operation 518 is completed control passes to switching operation 520.

During switching operation 520 the drain-side transistor is switched off. In other words, the drain-side transistor provides a drain-side high resistance path from the drain region to ground. After switching operation 520 is completed control passes to switching operation 522.

During switching operation 522 the source-side transistor is switched on. In other words, the source-side transistor provides a source-side low resistance path from the source region to ground. After switching operation 522 is completed control passes to controlling operation 524.

During controlling operation 524 the drain-side multiplexer conducts current from the drain region to the drain-side sense amplifier/write driver. After controlling operation 524 is completed control passes to controlling operation 526.

During controlling operation 526 the source-side multiplexer impedes current from the source region to the source-side sense amplifier/write driver. After controlling operation 526 is completed control passes to reading operation 528.

During reading operation 528 the programmed state of the first bit is read. Reading operation 528 includes sensing the threshold voltage of the cell transistor. For example, if the threshold voltage (from drain to source) of the cell transistor is high then the second electric charge is trapped in the second insulating spacer (the first binary state). If the threshold voltage (from drain to source) of the cell transistor is low then the second electric charge is not trapped in the second insulating spacer (the second binary state). In another embodiment of the invention, the change in resistance of the cell transistor is sensed in order to determine the binary state programmed to the second bit. After reading operation 528 is completed the process 504 ends.

Those skilled in the relevant art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, conventional processor, controller, microcontroller, state machine, etc. A processor can also be implemented as a combination of computing devices, e.g., a combination of a DSP and a microprocessor, a plurality of microprocessors, one or more microprocessors in conjunction with a DSP core, or any other such configuration. In addition, the term "processing" is a broad term meant to encompass several meanings including, for example, implementing program code, executing instructions, performing arithmetic operations, and the like.

Having described preferred embodiments for the content addressable memory device (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A memory cell comprising:
a cell transistor including a gate region, a source region, a drain region, and a first insulating spacer proximate the drain region and abutting the gate region, wherein the cell transistor is configured to trap a first electric charge in the first insulating spacer when a first bit in the memory cell is programmed to a first binary state and release the first electric charge in the first insulating spacer when the first bit in the memory cell is programmed to a second binary state;
a source-side sense amplifier configured to read a programmed state of the first bit;
a drain-side write driver configured to supply a program voltage to the drain region when the first bit is programmed;
a source-side transistor configured to conduct current from the source region to ground when the first bit is programmed to the first binary state, to impede current from the source region to ground when the first bit is programmed to the second binary state, and to impede current from the source region to ground when the first bit is read; and a drain-side transistor configured to conduct current from the drain region to ground when the first bit is read, and to impede current from the drain region to ground when the first bit is programmed.

2. The memory cell of claim 1, wherein when the first bit in the memory cell is programmed, no other bits are simultaneously programmed.

3. The memory cell of claim 1, further comprising:
a source-side multiplexer configured to conduct current from the source region to the source-side sense amplifier when the first bit is read and to impede current from the source region to the source-side sense amplifier when the first bit is programmed; and
a drain-side multiplexer configured to conduct current from the drain region to the drain-side write driver when the first bit is programmed and to impede current from the drain region to the drain-side write driver when the first bit is read.

4. The memory cell of claim 1, wherein the gate region is driven to a first voltage when the first bit is programmed to the first binary state, to a second voltage when the first bit is programmed to the second binary state, and a third voltage when the first bit is read, the first voltage being greater than the second voltage, and the third voltage being between the first voltage and the second voltage.

5. The memory cell of claim 1, further comprising:
wherein the cell transistor includes a second insulating spacer proximate the source region and abutting the gate region, the cell transistor is further configured to trap a second electric charge in the second insulating spacer when a second bit in the memory cell is programmed to the first binary state and release the second electric charge in the second insulating spacer when the second bit in the memory cell is programmed to the second binary state;
wherein the source-side transistor is further configured to conduct current from the source region to ground when the second bit is read, and to impede current from the source region to ground when the second bit is programmed; and
wherein the drain-side transistor is further configured to conduct current from the drain region to ground when the second bit is programmed to the first binary state, to impede current from the drain region to ground when the second bit is programmed to the second binary state, and to impede current from the drain region to ground when the second bit is read.

6. The memory cell of claim 5, wherein when the second bit in the memory cell is programmed, no other bits are simultaneously programmed.

7. The memory cell of claim 5, further comprising:
a source-side multiplexer configured to conduct current from the source region to the source-side sense amplifier when the first bit is read, to impede current from the source region to the source-side sense amplifier when the first bit is programmed, to conduct current from the source region to the source-side sense amplifier when the second bit is programmed, and to impede current from the source region to the source-side sense amplifier when the second bit is read; and
a drain-side multiplexer configured to conduct current from the drain region to the drain-side write driver when the first bit is programmed, to impede current from the drain region to the drain-side write driver when the first bit is read, to conduct current from the drain region to the drain-side write driver when the second bit is read, and to impede current from the drain region to the drain-side write driver when the second bit is programmed.

8. A memory array comprising:
a plurality of memory cells, each memory cell of the plurality of memory cells including a cell transistor including a gate region, a source region, a drain region, a first insulating spacer proximate the drain region and abutting the gate region, and a second insulating spacer proximate the source region and abutting the gate region, the cell transistor configured to trap a first electric charge in the first insulating spacer when a first bit in the memory cell is programmed to a first binary state and release the first electric charge in the first insulating spacer when the first bit in the memory cell is programmed to a second binary state, and trap a second electric charge in the second insulating spacer when a second bit in the memory cell is programmed to the first binary state and release the second electric charge in the second insulating spacer when the second bit in the memory cell is programmed to the second binary state;
a source-side sense amplifier/write driver unit configured to read a programmed state of the first bit and to supply a program voltage to the source region when the second bit is programmed;
a drain-side sense amplifier/write driver unit configured to read a programmed state of the second bit and to supply the program voltage to the drain region when the first bit is programmed;
a source-side transistor configured to conduct current from the source region to ground when the first bit is programmed to the first binary state, to impede current from the source region to ground when the first bit is programmed to the second binary state, to impede current from the source region to ground when the first bit is read, to conduct current from the source region to ground when the second bit is read, and to impede current from the source region to ground when the second bit is programmed; and
a drain-side transistor configured to conduct current from the drain region to ground when the first bit is read, to impede current from the drain region to ground when the first bit is programmed, to conduct current from the drain region to ground when the second bit is programmed to the first binary state, to impede current from the drain region to ground when the second bit is programmed to the second binary state, and to impede current from the drain region to ground when the second bit is read.

9. The memory array of claim 8, wherein when the first bit in one of the plurality of memory cells is programmed, no other bits in the plurality of memory cells are simultaneously programmed.

10. The memory array of claim 8, each memory cell further comprising:
a source-side multiplexer configured to conduct current from the source region to the source-side sense amplifier/write driver unit when the first bit is read, to impede current from the source region to the source-side sense amplifier/write driver unit when the first bit is programmed, to conduct current from the source region to the source-side sense amplifier/write driver unit when the second bit is programmed, and to impede current from the source region to the source-side sense amplifier/write driver unit when the second bit is read; and
a drain-side multiplexer configured to conduct current from the drain region to the drain-side sense amplifier/write driver unit when the first bit is programmed, to impede current from the drain region to the source-side sense amplifier/write driver unit when the first bit is read, to conduct current from the drain region to the drain-side sense amplifier/write driver unit when the second bit is read, and to impede current from the drain region to the source-side sense amplifier/write driver unit when the second bit is programmed.

11. A method for operating a memory cell, the method comprising:
programming a first bit in the memory cell to a first binary state by trapping a first electric charge in a first insulating spacer of a cell transistor, the first insulating spacer being proximate a drain region and abutting a gate region of the cell transistor;
programming the first bit in the memory cell to a second binary state by releasing the first electric charge in the first insulating spacer of the cell transistor; and
reading the programmed state of the first bit in the memory cell by sensing a leakage current at the drain region of the cell transistor; and
wherein programming the first bit to the first binary state further comprises:
supplying a program voltage to the drain region with a drain-side write driver;
switching on a source-side transistor such that a source-side low resistance path from the source region to ground is provided by the source-side transistor; and
switching off a drain-side transistor such that a drain-side high resistance path from the drain region to ground is provided by the drain-side transistor.

12. The method of claim 11, wherein when the first bit is programmed, no other bits are simultaneously programmed.

13. The method of claim 11, wherein programming the first bit to the first binary state further comprises:
controlling a source-side multiplexer to impede current from the source region to a source-side sense amplifier; and
controlling a drain-side multiplexer to conduct current from the drain region to the drain-side write driver.

14. The method of claim 11, wherein programming the first bit to the second binary state further comprises:
supplying a program voltage to the drain region by a drain-side write driver;
switching off a source-side transistor such that a source-side high resistance path from the source region to ground is provided by the source-side transistor; and
switching off a drain-side transistor such that a drain-side high resistance path from the drain region to ground is provided by the drain-side transistor.

15. The method of claim 14, wherein programming the first bit to the second binary state further comprises:
controlling a source-side multiplexer to impede current from the source region to a source-side sense amplifier; and
controlling a drain-side multiplexer to conduct current from the drain region to the drain-side write driver.

16. The method of claim 11, wherein reading the programmed state of the first bit further comprises:
switching off a source-side transistor such that a source-side high resistance path from the source region to ground is provided by the source-side transistor;
switching on a drain-side transistor such that a drain-side low resistance path from the drain region to ground is provided by the drain-side transistor.

17. The method of claim 16, wherein reading the programmed state of the first bit further comprises:
controlling a source-side multiplexer to conduct current from the source region to a source-side sense amplifier; and
controlling a drain-side multiplexer to impede current from the drain region to a drain-side write driver.

18. The method of claim 11, further comprising:
wherein programming the first bit to the first binary state further comprises supplying a first gate voltage at the gate region of the cell transistor;
wherein programming the first bit to the second binary state further comprises supplying a second gate voltage at the gate region of the cell transistor, wherein the first gate voltage being greater than the second gate voltage; and
wherein reading the programmed state of the first bit further comprises supplying a third gate voltage at the gate region of the cell transistor, wherein the third gate voltage is between the first gate voltage and the second gate voltage.

19. The method of claim 11, further comprising:
programming a second bit in the memory cell to the first binary state by trapping a second electric charge in a second insulating spacer of the cell transistor, the second insulating spacer being proximate the source region and abutting the gate region of the cell transistor;
programming the second bit in the memory cell to the second binary state by releasing the second electric charge in the second insulating spacer of the cell transistor; and
reading the programmed state of the second bit in the memory cell by sensing the leakage current at the source region of the cell transistor.

20. The method of claim 19, wherein when the second bit is programmed, no other bits are simultaneously programmed.

21. The method of claim 19, wherein programming the second bit to the first binary state further comprises:
supplying a program voltage to the source region by a source-side write driver;
switching on a drain-side transistor such that a drain-side low resistance path from the drain region to ground is provided by the drain-side transistor; and
switching off a source-side transistor such that a source-side high resistance path from the source region to ground is provided by the drain-side transistor.

22. The method of claim 19, wherein programming the second bit to the second binary state further comprises:
supplying a program voltage to the source region by a source-side write driver;
switching off a source-side transistor such that a source-side high resistance path from the source region to ground is provided by the source-side transistor; and
switching off a drain-side transistor such that a drain-side high resistance path from the drain region to ground is provided by the drain-side transistor.

23. The method of claim 19, wherein reading the programmed state of the second bit further comprises:
switching off a drain-side transistor such that a drain-side high resistance path from the drain region to ground is provided by the drain-side transistor;
switching on a source-side transistor such that a source-side low resistance path from the source region to ground is provided by the source-side transistor.

24. The method of claim 19, wherein reading the programmed state of the second bit further comprises:
controlling a drain-side multiplexer to conduct current from the drain region to a drain-side sense amplifier; and
controlling a source-side multiplexer to impede current from the source region to a source-side write driver.

* * * * *